US006978189B1

(12) United States Patent
Bode et al.

(10) Patent No.: US 6,978,189 B1
(45) Date of Patent: Dec. 20, 2005

(54) MATCHING DATA RELATED TO MULTIPLE METROLOGY TOOLS

(75) Inventors: Christopher A. Bode, Austin, TX (US); Matthew A. Purdy, Austin, TX (US); Alexander J. Pasadyn, Austin, TX (US)

(73) Assignee: Advanced Micro Devices, Inc.

( * ) Notice: Subject to any disclaimer, the term of this patent is extended or adjusted under 35 U.S.C. 154(b) by 535 days.

(21) Appl. No.: 10/156,450

(22) Filed: May 28, 2002

(51) Int. Cl.[7] .............................................. G06F 19/00
(52) U.S. Cl. ..................... 700/121; 700/95; 700/117; 716/4; 438/5
(58) Field of Search ...................... 700/90, 95, 117, 700/121; 438/5; 716/4

(56) References Cited

U.S. PATENT DOCUMENTS 6,806,951 B2 * 10/2004 Wack et al. .............. 356/237.2
2002/0165636 A1 * 11/2002 Hasan ......................... 700/121

* cited by examiner

*Primary Examiner*—Jayprakesh N. Gandhi
(74) *Attorney, Agent, or Firm*—Williams, Morgan & Amerson, P.C.

(57) ABSTRACT

A method and an apparatus for matching data related to an integrated metrology tool and a standalone metrology tool. At least one semiconductor wafer is processed. An integrated metrology tool and/or a standalone metrology tool is matched based upon a difference between metrology data relating to a processed semiconductor wafer acquired by the integrated metrology tool and metrology data acquired by the standalone metrology tool, using a controller.

34 Claims, 8 Drawing Sheets

1

MATCHING DATA RELATED TO MULTIPLE METROLOGY TOOLS

BACKGROUND OF THE INVENTION

1. Field of the Invention

This invention relates generally to semiconductor manufacturing, and, more particularly, to a method and apparatus for matching metrology data relating to an integrated metrology tool and a standalone metrology tool.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure. Typically, forming trenches across the semiconductor wafer and filling such trenches with an insulating material, such as silicon dioxide, form STI structures across the semiconductor wafers.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the metrology data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed across the underlying layer or layers of material, e.g., a layer of polysilicon, metal or insulating material, to transfer the desired pattern to the underlying layer. The patterned layer of photoresist is comprised of a plurality of features, e.g. line-type features or opening-type features that are to be replicated in an underlying process layer.

Turning now to FIG. 2, a flowchart depiction of a typical prior art semiconductor wafer processing flow, is illustrated. A lot of semiconductor wafers 105 are generally processed by a manufacturing system (block 210). The manufacturing system may then acquire inline and/or offline metrology data from the processed semiconductor wafers 105 (block 220). Generally, the metrology data is acquired by one or more standalone metrology tool. The manufacturing system may then analyze the metrology data to check for errors and faults during the processing of semiconductor wafers 105 (block 230). Based upon the analyzed metrology data, the manufacturing system may modify subsequent processing operations performed on semiconductor wafers 105 (block 240).

One problem associated with the current methodology includes the fact that there may be calibration/matching differences between a plurality of metrology tools. In other words, metrology data acquired by one metrology tool may be based upon a different reference standard compared to metrology data acquired from a second metrology tool. Therefore, compensation or corrections made based upon the metrology data acquired by the plurality of metrology tools may be inconsistent, thereby causing further processing errors. Furthermore, inherent errors in the semiconductor wafers 105 may be interpreted differently by different metrology tools if they are not adequately calibrated. Additionally, if the analyzed metrology data has not been adjusted for calibration/matching errors, the analyzed metrology data may contain inherent errors. The metrology data containing the inherent errors may then be used to modify or alter the control of subsequent manufacturing of semiconductor wafers 105, thereby causing additional errors.

The present invention is directed to overcoming, or at least reducing the effects of, one or more of the problems set forth above.

SUMMARY OF THE INVENTION

In one aspect of the present invention, a method is provided for matching data related to an integrated metrology tool and a standalone metrology tool. At least one semiconductor wafer is processed. An integrated metrology tool and/or a standalone metrology tool is matched based upon a difference between metrology data relating to a processed semiconductor wafer acquired by the integrated metrology tool and metrology data acquired by the standalone metrology tool using a controller.

In another aspect of the present invention, a system is provided for matching data related to an integrated metrology tool and a standalone metrology tool. The system of the present invention comprises: a processing tool comprising an integrated metrology tool. The integrated metrology tool is adapted to acquire integrated metrology data related to a semiconductor wafer processed by the processing tool. The system also comprises a standalone metrology tool communicatively coupled to the processing tool. The standalone metrology tool is adapted to acquire standalone metrology data from the semiconductor wafer. The system also comprises a process controller operatively coupled to the processing tool and the standalone metrology tool. The process controller is adapted to calibrate the integrated metrology tool and/or the standalone metrology tool based upon a difference between the integrated metrology data and the standalone metrology data.

In another aspect of the present invention, an apparatus is provided for matching data related to an integrated metrology tool and a standalone metrology tool. The apparatus of the present invention comprises a process controller operatively coupled to the processing tool and the standalone metrology tool. The process controller is adapted to calibrate an integrated metrology tool and/or a standalone metrology tool based upon a difference between metrology data relating to a processed semiconductor wafer acquired by the integrated metrology tool and metrology data acquired by the standalone metrology tool using a controller.

In yet another aspect of the present invention, a computer readable program storage device encoded with instructions is provided for matching data related to an integrated metrology tool and a standalone metrology tool. The computer readable program storage device encoded with instructions when executed by a computer matches an integrated metrology tool and/or a standalone metrology tool. The matching is performed based upon a difference between metrology data relating to a processed semiconductor wafer acquired by the integrated metrology tool and metrology data acquired by the standalone metrology tool using a controller.

BRIEF DESCRIPTION OF THE DRAWINGS

The invention may be understood by reference to the following description taken in conjunction with the accompanying drawings, in which like reference numerals identify like elements, and in which.

Figure 1:
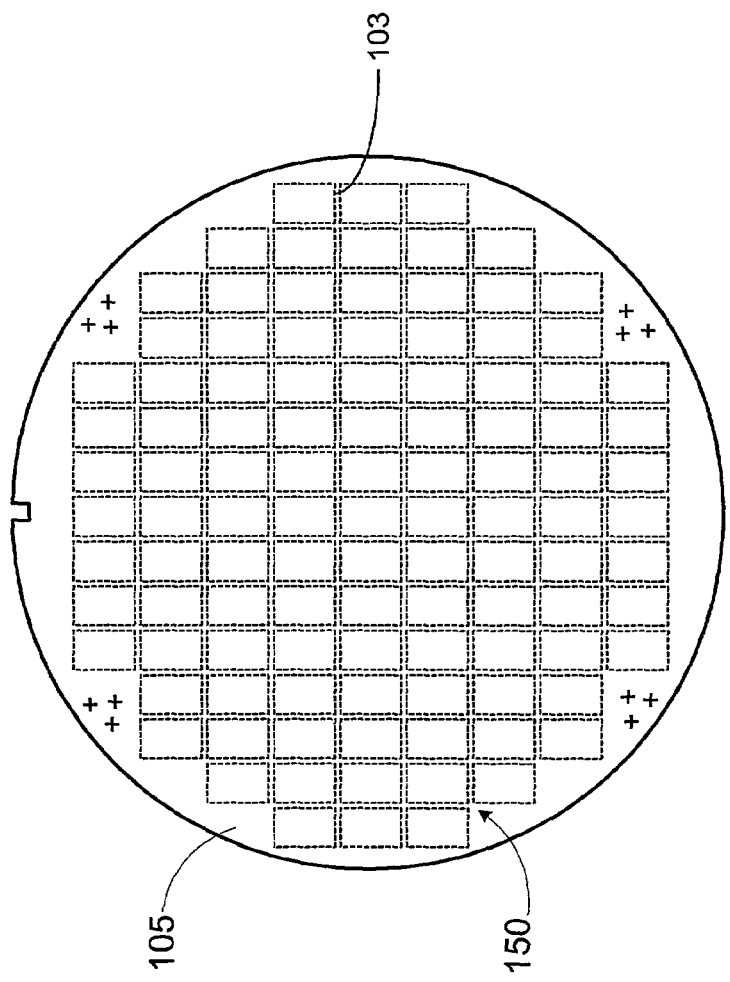
FIG. 1 is a simplified diagram of a prior art semiconductor wafer being processed.
Figure 2:
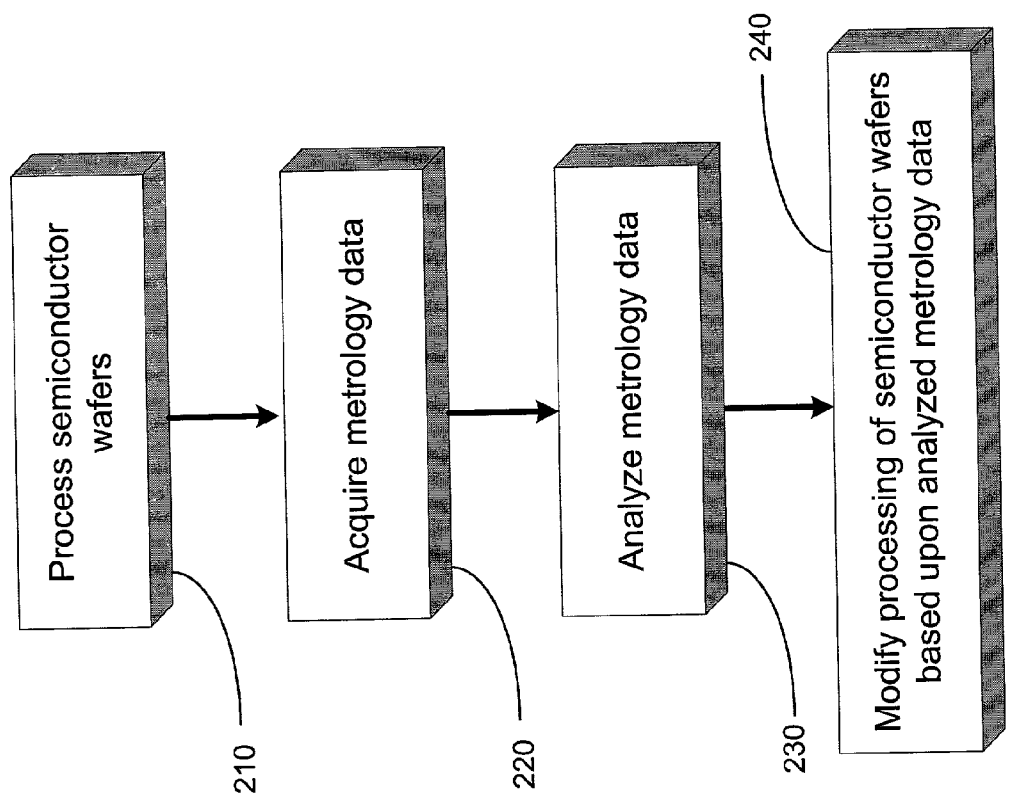
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Embodiments of the present invention provide for calibrating or matching an integrated metrology tool with a standalone metrology tool and/or calibrating/matching a first integrated metrology tool with a second integrated metrology tool. The integrated metrology tool and the standalone metrology tool may be employed in an inline fashion (i.e., during the process flow of processes performed on a semiconductor wafer 105). The integrated metrology tool is a metrology data acquisition tool that is substantially integrated into a processing tool. Data from the integrated metrology tool is acquired and analyzed. The data and/or resulting analysis may then be stored. Similarly, standalone metrology data may be acquired, analyzed, and stored in various embodiments of the present invention.

Embodiments of the present invention provide for using a test semiconductor wafer 105 to acquire metrology data using the integrated metrology tool, acquiring corresponding metrology data using the standalone metrology tool and performing a calibration analysis to correct a calibration difference between the integrated metrology tool and the standalone metrology tool data. Furthermore, production wafers that are processed by a processing tool may be analyzed by the integrated metrology tool and the standalone metrology tool and a comparison of the results may be performed to conduct a calibration analysis. Embodiments of the present invention provide for calibrating/matching the integrated metrology tool and/or the standalone metrology tool such that consistent and compatible metrology data may be received from both.

In one embodiment, inline metrology data includes metrology data acquired by a standalone metrology tool yielding data associated with a particular processing operation or tied to a particular process. For example, inline metrology data may include data relating to film thickness, line-width of certain features on processed semiconductor wafers 105, overlay measurements resulting from photolithography measurements, and the like. An integrated metrology tool, which is described in greater detail below, may be used to acquire integrated metrology data. Integrated metrology may refer to metrology data acquired by metrology tools that operate within a sequence of wafer movement during the processing of the wafers. In one embodiment, integrated metrology data includes inline metrology data that is acquired by a metrology tool integrated into a processing tool, which is described in greater detail below. Offline metrology data generally refers to metrology data acquired from semiconductor wafers 105 after substantial completion of processing of the semiconductor wafers 105.

Figure 3:
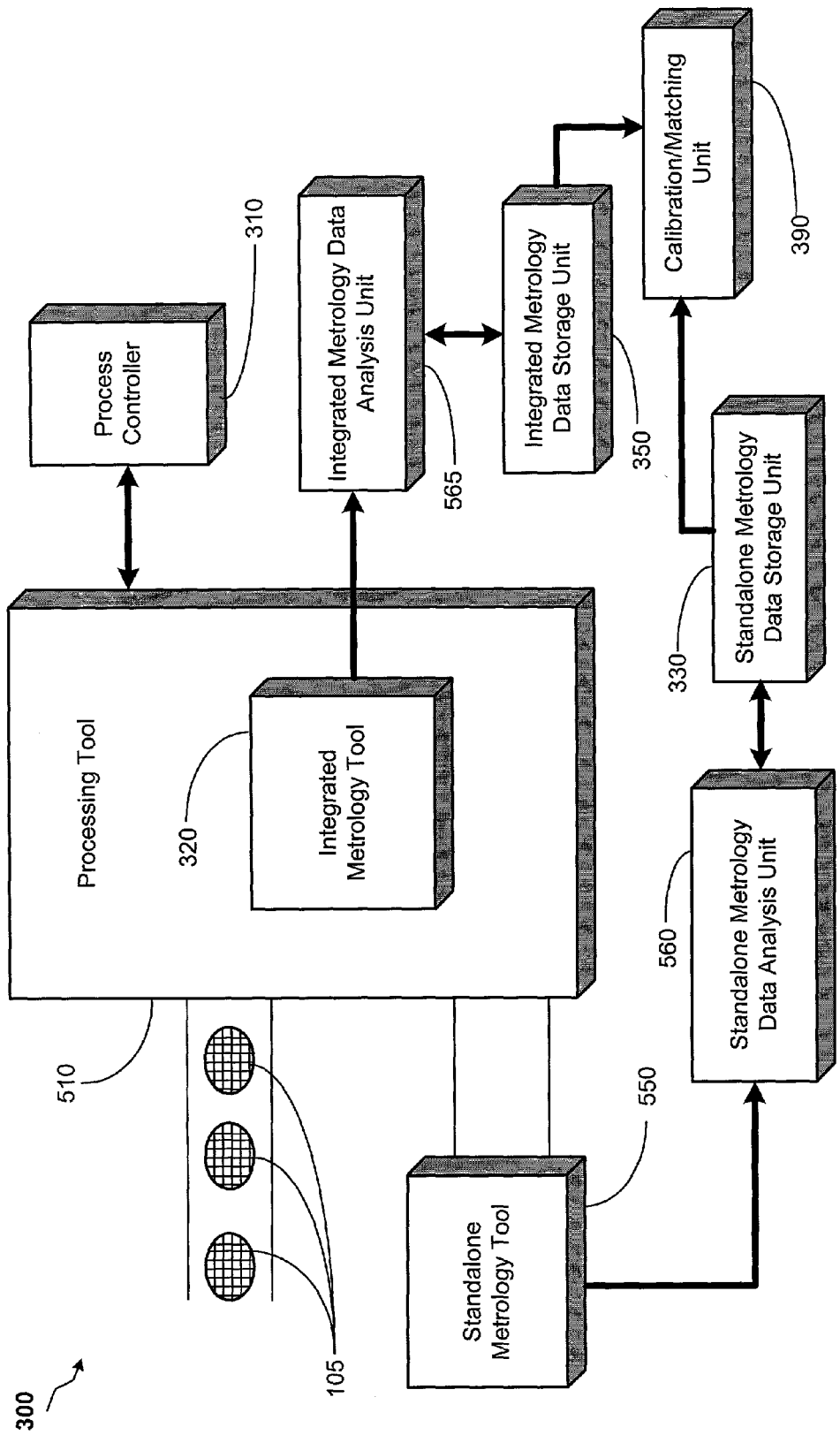
FIG. 3 is a block diagram representation of a system in accordance with one illustrative embodiment of the present invention.

Turning now to FIG. 3, a system 300 in accordance with embodiments of the present invention is illustrated. The system 300 comprises a processing tool 510 that is controlled by a process controller 310. The process controller 310 may be one of a plurality of manufacturing control systems, such as an APC system. In one embodiment, the processing tool 510 comprises an integrated metrology tool 320. In one embodiment, the integrated metrology tool 320 may be incorporated into the flow of semiconductor wafers 105 through the processing tool 510. In other words, the semiconductor wafers 105 generally pass through the integrated metrology tool 320, as the semiconductor wafers 105 would pass through other processing stations (not shown) in the processing tool 510.

In one embodiment, the integrated metrology tool 320 is capable of acquiring inline metrology data (e.g., acquiring metrology data of semiconductor wafers 105 while they are still under the control of the processing tool 510). Acquiring inline metrology data using the integrated metrology tool 320 is generally less intrusive to a manufacturing process flow as compared to acquiring offline metrology data, which requires the use of a standalone metrology tool 550. Data acquired by the integrated metrology tool 320 is sent to an integrated metrology data analysis unit 565.

The integrated metrology data analysis unit 565 organizes, analyzes, and correlates metrology data acquired by the integrated metrology tool 320. The integrated metrology data, which is data acquired by the integrated metrology tool 320, may then be stored in an integrated metrology data storage unit 350. The integrated metrology data analysis unit 565 may be a standalone software unit, a hardware unit, or a firmware unit. In various embodiments, the integrated metrology data analysis unit 565 may be integrated into a computer system that may be associated with the process controller 310, or may be incorporated into the integrated metrology tool 320.

One of more of the semiconductor wafers 105 processed by the processing tool 510 and analyzed by the integrated metrology tool 320 may also be sent to a standalone metrology tool 550. In one embodiment, the standalone metrology tool 550 may be situated in an inline fashion as part of the inline process flow performed on the semiconductor wafers 105. In an alternative embodiment, the standalone metrology tool 550 may be positioned as an offline metrology tool, which acquires metrology data when the processing tool 510 relinquishes control of the semiconductor wafers 105. A standalone metrology data analysis unit 560 organizes, analyzes and correlates metrology data acquired by the standalone metrology tool 550. The standalone metrology data, which is data acquired by the standalone metrology tool 550, may then be stored into a standalone metrology data storage unit 330.

In one embodiment, the integrated metrology data storage unit 350 and the standalone metrology data storage unit 330 may be integrated into a single database or a single storage unit. The stored integrated metrology data and the stored standalone metrology data is then sent to a calibration/matching unit 390. The calibration/matching unit 390 is capable of analyzing the respective metrology data received from the integrated metrology data storage unit 350 and standalone metrology data storage unit 330, and performing a comparison function upon the data for calibration purposes. Furthermore, a reference point may be used by the calibration/matching unit 390 to determine the deviation of the metrology data acquired by the standalone metrology tool 550 and/or integrated metrology tool 320. The to reference point used by the calibration/matching unit 390 may be the data from the standalone metrology tool 550, data from the integrated metrology tool 320, or reference data provided to the process controller 310 from an external source. The reference data may relate to predetermined calculations relating to the metrology measurements that should be ideally acquired from a processed semiconductor wafer 105.

The system 300 may route a test semiconductor wafer 105 through the processing tool 510 for analysis by the integrated metrology tool 320. The test semiconductor wafer 105 may then be routed to the standalone metrology tool 550 for metrology data acquisition. The calibration/matching unit 390 may then determine the differences between the accuracies of the metrology tools 320, 550 and perform a calibration function upon the integrated metrology tool 320 and/or the standalone metrology tool 550. In an alternative embodiment, production wafers, which are semiconductor wafers 105 used for actual manufacturing production, may be routed to the integrated metrology tool 320 and the standalone metrology tool 550 for metrology acquisition. The acquired metrology data may then be analyzed by the calibration/matching unit 390 to match the integrated metrology tool 320 and/or the standalone metrology tool 550. In yet another alternative embodiment, a subset of the production wafers that are analyzed by the integrated metrology tool 320 may be examined by the standalone metrology tool 550, whose data may then be analyzed by the calibration/matching unit 390 to perform calibration. The calibration processes provided by various embodiments of the present invention may also be used to perform calibration between a plurality of integrated metrology tools 320 and/or calibration between a plurality of standalone metrology tools 550.

Figure 4:
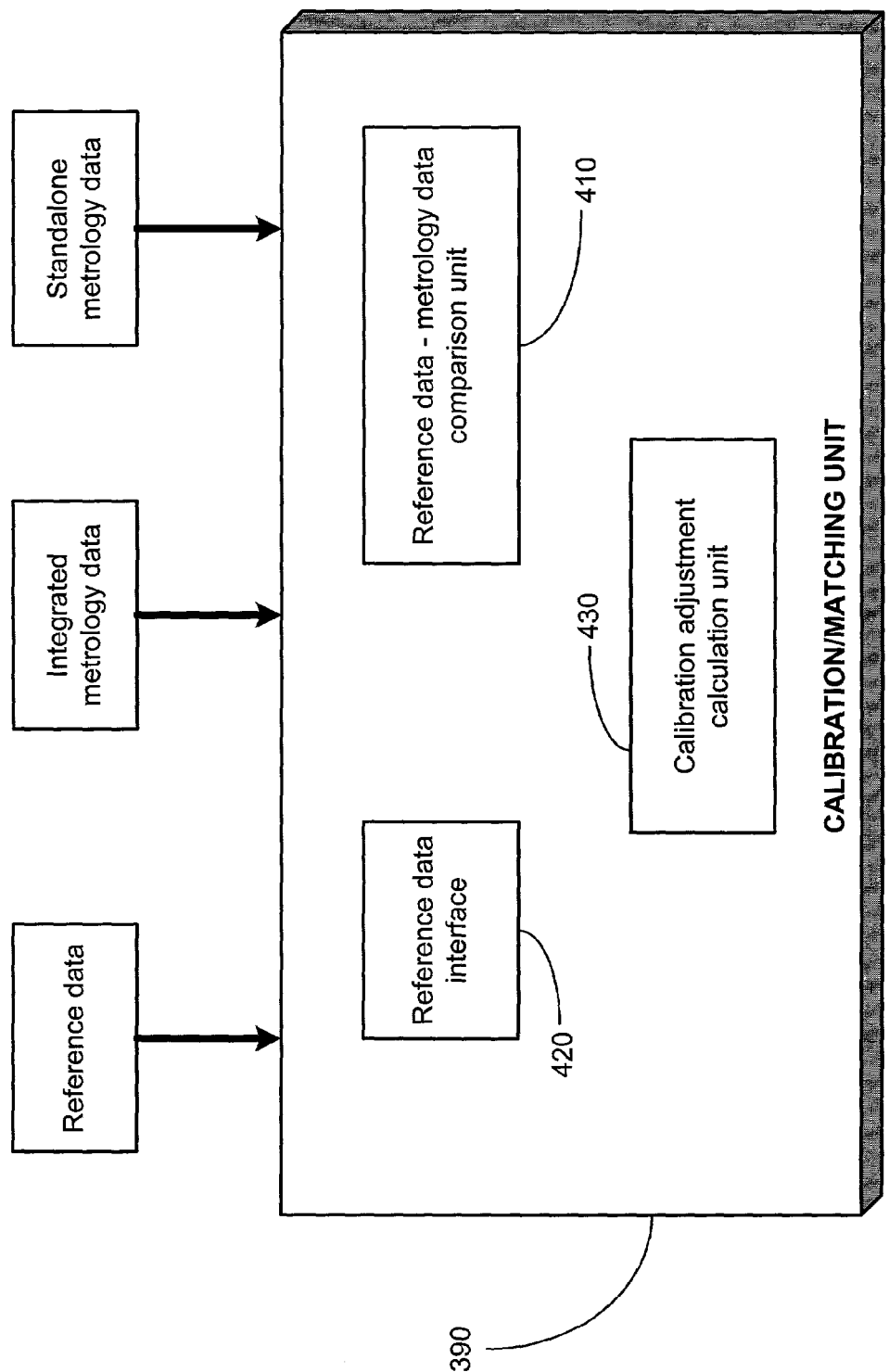
FIG. 4 is a more detailed block diagram representation of a calibration/matching unit from the system of FIG. 3, in accordance with one illustrative embodiment of the present invention.

Turning now to FIG. 4, a more detailed block diagram illustration of the calibration/matching unit 390 is provided. The calibration/matching unit 390 may comprise a reference data interface 420, which is capable of receiving reference data to be used as a reference standard when comparing metrology data from different metrology acquisition tools 320, 550. A reference data-metrology data comparison unit 410 performs a comparison function. The comparison function may comprise analyzing data from the integrated metrology tool 320 and data from the standalone metrology tool 550 and determining the relative differences that may be resolved by calibrating/matching one of the metrology tools 320, 550. The metrology data may also be compared to the reference data that is received from the reference data interface 420 to determine whether a calibration correction can be made to compensate for the differences.

A calibration adjustment calculation unit 430 determines the amount of calibration and the type of calibration that may be performed on the integrated metrology tool 320 and/or to the standalone metrology tool 550. More details relating to the calibration of the metrology tools 320, 550 is provided below. In one embodiment, the reference data interface 420 and the reference data-metrology data comparison unit 410 and the calibration adjustment calculation unit 430 may be software units, hardware unit, or firmware units that are integrated into the calibration/matching unit 390.

Figure 5:
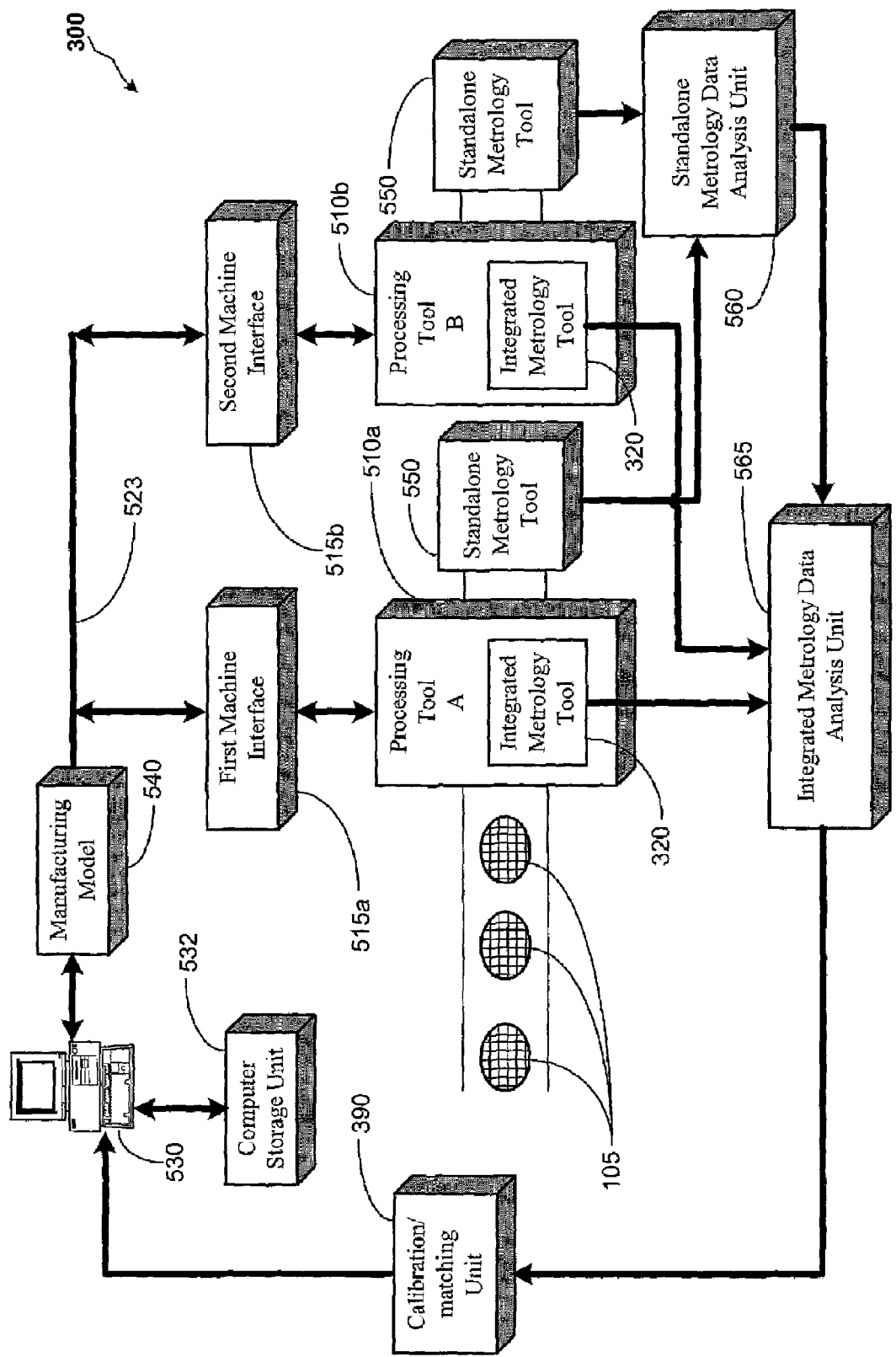
FIG. 5 illustrates a more detailed block diagram representation of the system shown in FIG. 3, in accordance with one illustrative embodiment of the present invention.

Turning now to FIG. 5, a more detailed block diagram of the system 300 in accordance with one embodiment of the present invention is illustrated. Semiconductor wafers 105 are processed on processing tools 510a, 510b using a plurality of control input signals, or manufacturing parameters, provided via a line or network 523. The control input signals, or manufacturing parameters, on the line 523 are sent to the processing tools 510a, 510b from a computer system 530 via machine interfaces 515a, 515b. The first and second machine interfaces 515a, 515b are generally located outside the processing tools 510a, 510b. In an alternative embodiment, the first and second machine interfaces 515a, 515b are located within the processing tools 510a, 510b. The semiconductor wafers 105 are provided to and carried from a plurality of processing tools 510. In one embodiment, semiconductor wafers 105 may be provided to a processing tool 510 manually. In an alternative embodiment, semiconductor wafers 105 may be provided to a processing tool 510 in an automatic fashion (e.g., robotic movement of semiconductor wafers 105). In one embodiment, a plurality of semiconductor wafers 105 is transported in lots (e.g., stacked in cassettes) to the processing tools 510. The processing tools 510a, 510b may comprise integrated metrology tools 320, capable of acquiring integrated metrology data in an inline fashion.

In one embodiment, the computer system 530 sends control input signals, or manufacturing parameters, on the line 523 to the first and second machine interfaces 515a, 515b. The computer system 530 is capable of controlling processing operations. In one embodiment, the computer system 530 is a process controller. The computer system 530 is coupled to a computer storage unit 532 that may contain a plurality of software programs and data sets. The computer system 530 may contain one or more processors (not shown) that are capable of performing the operations described herein. The computer system 530 employs a manufacturing model 540 to generate control input signals on the line 523. In one embodiment, the manufacturing model 540 contains a manufacturing recipe that determines a plurality of control input parameters that are sent on the line 523 to the processing tools 510a, 510b.

In one embodiment, the manufacturing model 540 defines a process script and input control that implement a particular manufacturing process. The control input signals (or control input parameters) on the line 523 that are intended for processing tool A 510a are received and processed by the first machine interface 515a. The control input signals on the line 523 that are intended for processing tool B 510b are received and processed by the second machine interface 515b. Examples of the processing tools 510a, 510b used in semiconductor manufacturing processes are steppers, etch process tools, deposition tools, and the like.

One or more of the semiconductor wafers 105 that are processed by the processing tools 510a, 510b may also be analyzed by the integrated metrology tools 320. Metrology data from the integrated metrology tools 320 may be collected, organized, and analyzed by the integrated metrology data analysis unit 565. One or more of the semiconductor wafers 105 that are processed by the processing tools 510a, 510b can also be sent to a standalone metrology tool 550 for acquisition of metrology data. The standalone metrology tool 550 may be a scatterometry data acquisition tool, an overlay-error measurement tool, a critical dimension measurement tool, and the like. In one embodiment, the standalone metrology tool 550 examines one or more processed semiconductor wafers 105. The standalone metrology data analysis unit 560 may collect, organize, and analyze metrology data from the standalone metrology tool 550. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data acquired by the metrology tools 320, 550 may be used to calibrate/match the metrology tools 320, 550 to improve the accuracy and efficiency of process corrections made in response to metrology data.

As described above, the standalone metrology tool 550 provides standalone metrology data to the standalone metrology data analysis unit 560. Likewise, the integrated metrology tool 320 provides integrated metrology data to the integrated metrology data analysis unit 565. The calibration/matching unit 390 may receive the integrated metrology data and the standalone metrology data and perform a calibration analysis function, which provides data that may be used to calibrate/match (calibration data) the integrated metrology tool 320 and/or the standalone metrology tool 550. The calibration data is sent to the computer system 530, which may perform the calibration requested by the calibration/matching unit 390.

Figure 6:
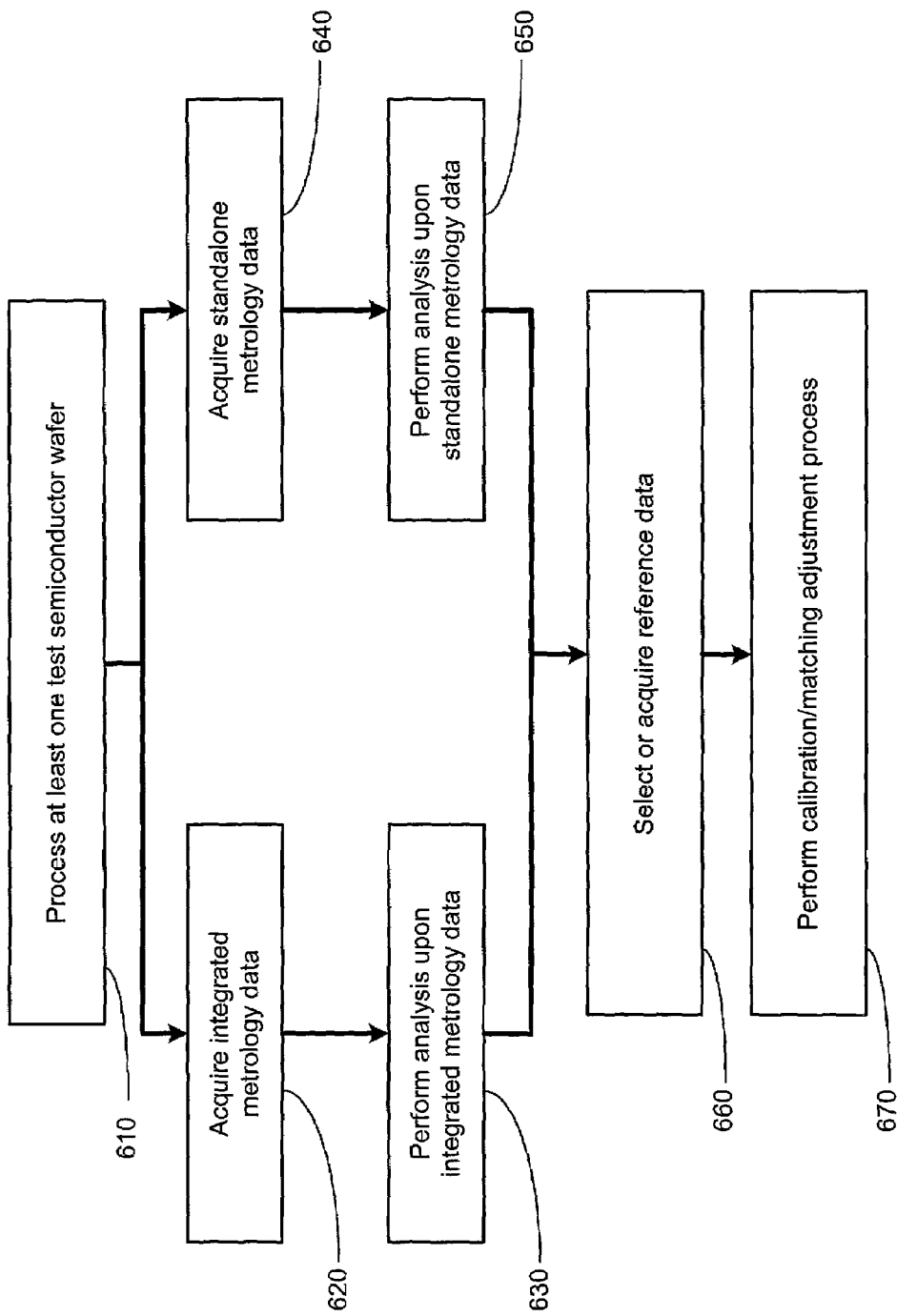
FIG. 6 illustrates a flowchart depiction of a method in accordance with a first illustrative embodiment of the present invention.

Turning now to FIG. 6, a flow chart depiction of a first embodiment of the method in accordance with an illustrative embodiment of the present invention is provided. The system 300 performs a process upon one or more test semiconductor wafers 105 (block 610). Upon processing the test semiconductor wafer(s) 105, the system 300 acquires integrated metrology data (block 620). The system 300 may also perform analysis upon the acquired integrated metrology data (block 630). The integrated metrology data relating to the processed test semiconductor wafers 105 is acquired by the integrated metrology tool 320. As described above, the analysis of the integrated metrology data is performed by the integrated metrology data analysis unit 565.

The system 300 also acquires standalone metrology data related to the processed test semiconductor wafer(s) 105 that were analyzed by the integrated metrology tool 320 (block 640). The standalone metrology data may be acquired in an inline fashion or in an offline fashion by the standalone metrology tool 550. The standalone metrology data analysis unit 560 performs a metrology analysis on the standalone metrology data (block 650). In one embodiment, the metrology data may be stored for subsequent analysis.

The system 300 may then select or acquire reference data for comparison of the acquired and analyzed metrology data (block 660). The selection of the reference data may entail selecting either the stored integrated metrology or standalone metrology data, and using the data as a reference point when comparing the integrated metrology data to the standalone metrology data. The result of the comparison may be used to perform a calibration analysis.

In an alternative embodiment, the acquisition of reference data entails acquiring external data (e.g., metrology data from the standalone metrology tool 550) to be used as a reference for comparison between the external data and the integrated metrology data and/or for comparison between the external data and the standalone metrology data. The external reference data may be provided by the computer system 530 or from an external data source. Based upon the integrated metrology data, the standalone metrology data, and the reference data, the system 300 performs a calibration adjustment process (block 670). The calibration adjustment process comprises the function of calibrating/matching the integrated metrology tool 320 and/or the standalone metrology tool 550 such that metrology data acquired by the integrated metrology tool 320 and standalone metrology tool 550 are consistent. A more detailed illustration of the steps for performing the calibration adjustment process indicated in block 670 of FIG. 6 is provided in FIG. 7 and accompanying description below.

Figure 7:
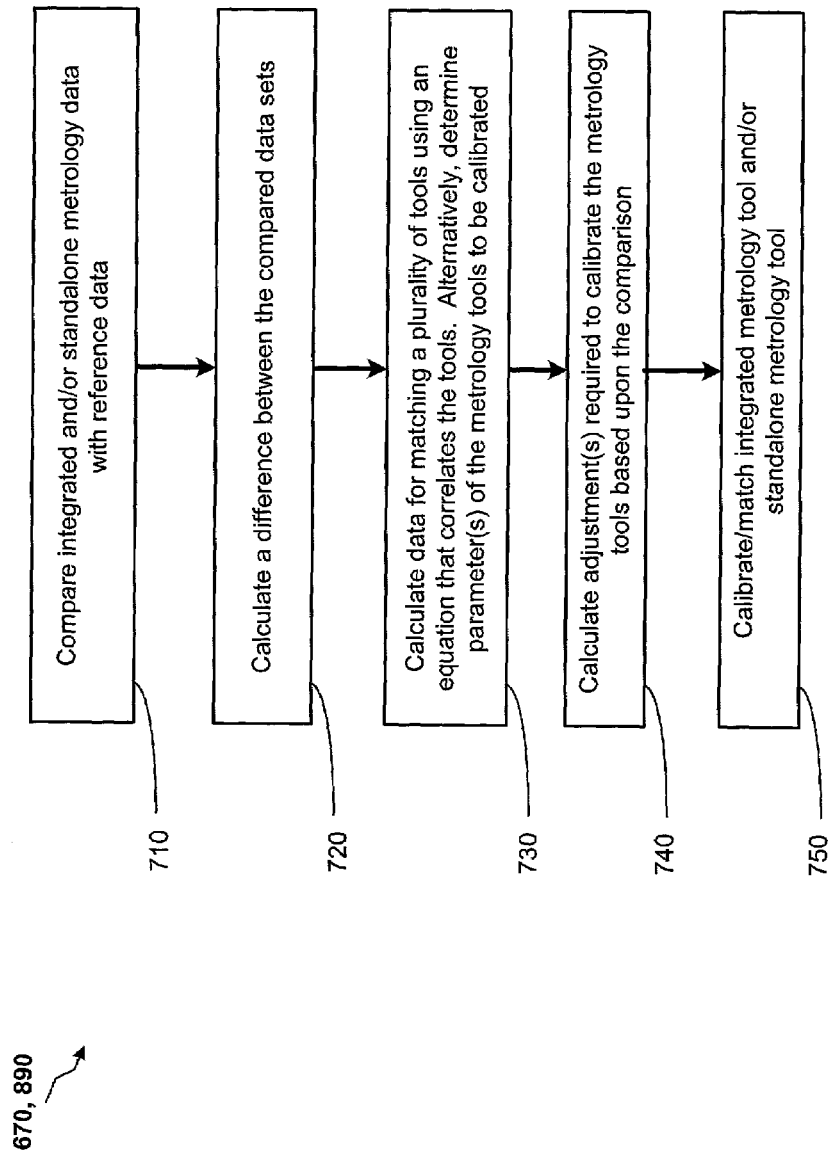
FIG. 7 illustrates a flowchart depiction of a method of performing a calibration adjustment process, as indicated in FIG. 6, in accordance with one illustrative embodiment of the present invention.

Turning now to FIG. 7, a flow chart depiction of one embodiment of the steps for performing the calibration adjustment process, as indicated in block 670 of FIG. 6 is illustrated. The system 300 compares integrated metrology data and/or standalone metrology data with the acquired reference data (block 710). In an alternative embodiment, the system 300 may use the standalone metrology data as a reference point and may compare the integrated metrology data to the reference point. In yet another embodiment, the system 300 may use the integrated metrology data as a reference point and may compare the standalone metrology data to the reference point.

Based upon the comparison, the system 300 calculates a difference between the integrated metrology data and the reference data, or a difference between the standalone metrology data and the reference data, or a difference between the integrated metrology data and the standalone metrology data (block 720). For example, integrated metrology data that provides a measurement relating to the critical dimension of a structure formed on the test semiconductor wafers 105 may differ from the measurement provided by standalone metrology data, or may differ from the reference data. Based upon this difference, the system 300 may perform calibration to the integrated metrology tool 320 and/or the standalone metrology tool 550.

The system 300 then calculates data for matching a plurality of metrology tools 320, 550 (block 730). In one embodiment, the calculation for matching a plurality of metrology tools 320, 550 includes generating an equation that defines a relationship between the plurality of metrology tools 320, 550. For example, a linear equation may be used to define a linear relationship between the thickness measurements from a plurality of metrology tools 320, 550 (see Equation 1).

$$T_{sa} = M \times T_{im} + b \qquad \text{Equation 1}$$

$T_{sa}$ is the thickness measured by the standalone metrology tool 550, $T_{im}$ is thickness measured by the integrated metrology tool 320, M is the slope of the linear relationship between the metrology tools 320, 550, and b is the intercept of the line defined by Equation 1. If data from both the metrology tools 320, 550 are matched, then the slope of the line, M, would be approximately equal to one. The intercept b may define a term that is equivalent to the adjustment to one the metrology tools 320, 550 if the slope of Equation 1 (M) is not one (i.e, if the metrology tools 320, 550 are not matched). Based on the value of the slope variable M, and adjustment to the intercept variable b, may be made. Calculations relating to Equation 1 may be used to adjust the metrology results from the metrology tools 320, 550 such that they are matched. This adjustment may be performed at the point of data collection or in a later operation, such as during data analysis, during a process control step, or the like.

In an alternative embodiment, in order to calibrate or match the metrology tools 320, 550, the system 300 may determine one or more parameters of the integrated metrology tool 320 and/or standalone metrology tool 550 that is to be calibrated or adjusted (block 730). The parameters that may be calibrated may include, but are not limited to, the sensitivity of the detector that detects light in a scatterometry-related metrology analysis, parameters relating to a device that measures the critical dimension of a structure formed on the semiconductor wafers 105, parameters relating to a device that measures the film thickness, and the like.

Based upon the comparison described above, the system 300 may then calculate an adjustment that may be made upon the parameters for calibrating/matching the parameters (block 740). Based upon the adjustments to be made on particular parameters of the integrated metrology tool 320 and/or the standalone metrology tool 550, the system 300 calibrates the selected metrology tool 320, 550 (e.g., the integrated metrology tool 320 and/or the standalone metrology tool 550) (see block 750). Completion of the steps described in FIG. 7 substantially completes the process of performing a calibration adjustment process described in block 670 of FIG. 6.

Figure 8:
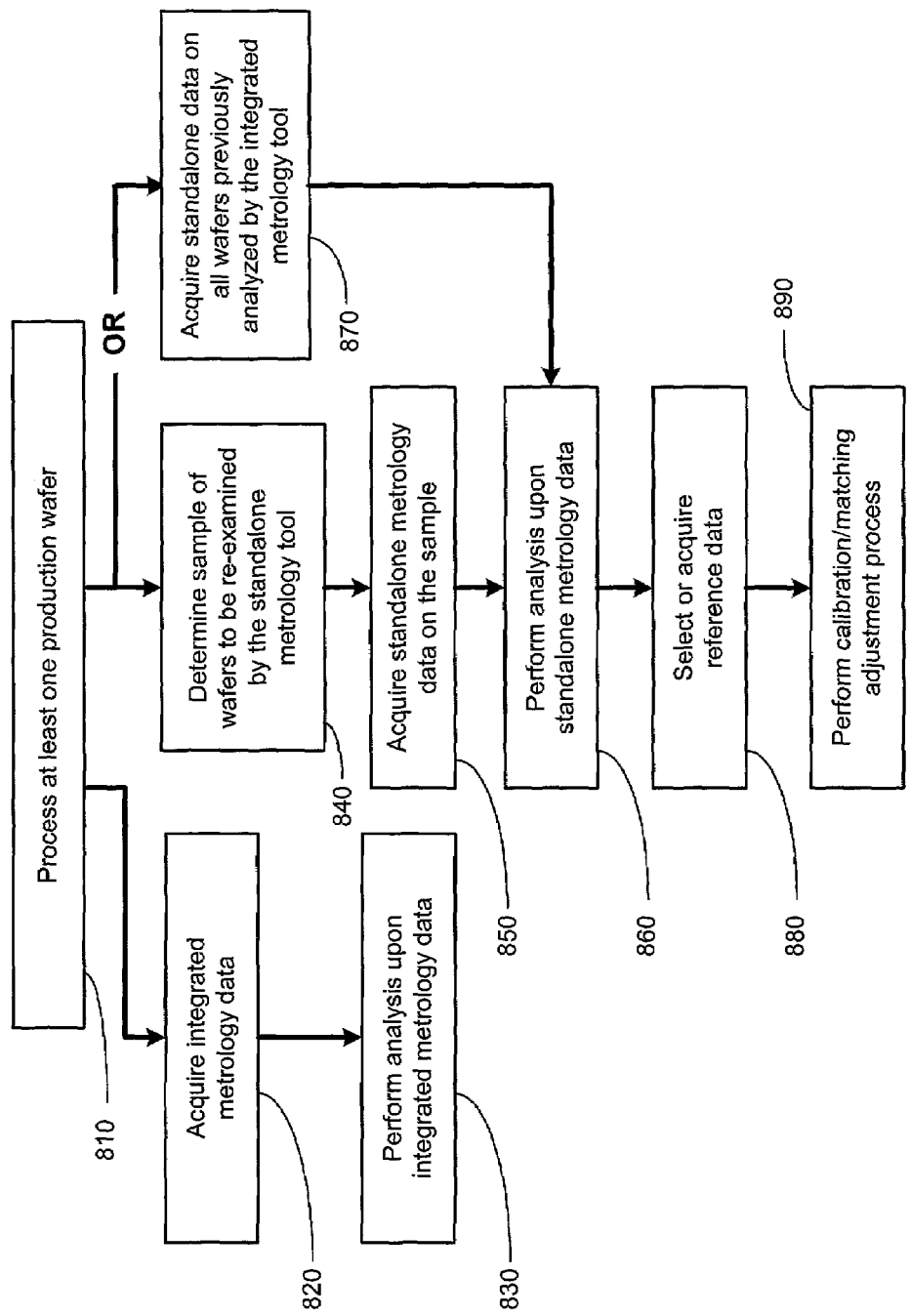
FIG. 8 illustrates a flowchart depiction of a method in accordance with a first illustrative embodiment of the present invention.

Turning now to FIG. 8, a second embodiment of performing the calibration process in accordance with an alternative embodiment of the present invention is illustrated. The system 300 performs processing of at least one production wafer, which generally comprises a semiconductor wafer 105 that is sent through a normal production process, which may be used to produce/manufacture semiconductor devices from the processed semiconductor wafers 105 (block 810). The system 300 acquires integrated metrology data from one or more of the processed production wafers using the integrated metrology tool 320 (block 820). The system 300 may perform analysis of the integrated metrology data as described above (block 830).

As production wafers are being processed and integrated metrology data is being acquired, production wafer(s) may then be sent to a standalone metrology tool 550 for metrology data acquisition (block 840). A sample of the production wafers that were analyzed by the integrated metrology tool 320 may be examined by the standalone metrology tool 550. The system 300 then acquires standalone metrology data from the sampled production wafer using the standalone metrology tool 550 (block 850). The standalone metrology data is then analyzed by the system 300 (block 860). Alternatively, the system 300 may acquire standalone metrology data from substantially all production wafers that have been processed and analyzed by the integrated metrology tool 320, instead of sampling a few of them (block 870). The standalone metrology data is then analyzed by the system 300 (block 860).

The system 300 may then select or acquire reference data for comparison of the acquired and analyzed metrology data (block 880). As described above, the selection of the reference data may entail selecting either the stored integrated metrology or standalone metrology data, and using the metrology data as a reference point when comparing the integrated metrology data to the standalone metrology data. The result of the comparison may be used to perform a calibration analysis. Based upon the integrated metrology data, the standalone metrology data, and the reference data, the system 300 performs a calibration adjustment process (block 890). The calibration adjustment process comprises the function of calibrating/matching the integrated metrology tool 320 and/or the standalone metrology tool 550 such that metrology data acquired by the integrated metrology tool 320 and standalone metrology tool 550 are consistent. A more detailed illustration of the steps for performing the calibration adjustment process indicated in block 890 of FIG. 8 is provided in FIG. 7 and accompanying description above.

Upon completion of the steps described in FIGS. 6, 7 and 8, substantial uniformity and consistency of metrology data acquired by the integrated metrology tool 320 and the standalone metrology tool 550 may be achieved, thereby resulting in consistent metrology data that may be used to perform adjustments to the semiconductor wafer 105 manufacturing processes performed by the system 300.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
processing at least one semiconductor wafer; and
matching an integrated metrology tool and a standalone metrology tool based upon a difference between metrology data relating to said processed semiconductor wafer acquired by said integrated metrology tool and metrology data acquired by said standalone metrology tool, using a controller, wherein said matching comprises performing a calibration function upon at least one of said integrated metrology tool and said standalone metrology tool.

2. The method of claim 1, wherein matching at least one of an integrated metrology tool and a standalone metrology tool based upon a difference between metrology data relating to said processed semiconductor wafer comprises calculating a difference between metrology data relating to substantially the same metrology data acquired from said integrated metrology tool and said standalone metrology tool.

3. The method of claim 2, wherein calculating a difference between metrology data relating to substantially the same metrology data acquired from said integrated metrology tool and said standalone metrology tool further comprises acquiring metrology data relating to a first portion of said semiconductor wafer using said integrated metrology tool and acquiring metrology data relating to a first portion of said semiconductor wafer using said standalone metrology tool.

4. The method of claim 2, wherein calculating a difference between metrology data relating to substantially the same metrology data acquired from said integrated metrology tool and said standalone metrology tool further comprises acquiring inline metrology data using said standalone metrology tool.

5. The method of claim 2, wherein calculating a difference between metrology data relating to substantially same metrology data acquired from said integrated metrology tool and said standalone metrology tool further comprises acquiring offline metrology data using said standalone metrology tool.

6. The method of claim 1, wherein matching at least one of an integrated metrology tool and a standalone metrology tool based upon a difference between metrology data relating to said processed semiconductor wafer her comprises comparing said metrology data acquired by said integrated metrology tool to a reference data.

7. The method of claim 1, wherein matching at least one of an integrated metrology tool and a standalone metrology tool based upon a difference between metrology data relating to said processed semiconductor wafer further comprises comparing said metrology data acquired by said standalone metrology tool to a reference data.

8. The method of claim 1, wherein matching at least one of an integrated metrology tool and a standalone metrology tool based upon a difference between metrology data relating to a processed semiconductor wafer further comprises defining a linear equation that comprises a slope variable to define an amount of matching and an intercept variable to define an adjustment based upon a value of said slope variable.

9. The method of claim 1, wherein matching at least one of an integrated metrology tool and a standalone metrology tool based upon a difference between metrology data relating to a processed semiconductor wafer further comprises matching at least one of a sensitivity of a detector that detects light in a scatterometry-related integrated metrology tool, a parameter relating to measurement of a critical dimension of a structure formed on said semiconductor wafers, and a parameter relating to a measurement of a film thickness of a layer of said semiconductor wafer.

10. A method, comprising:
processing at least one semiconductor wafer; and
calibrating at least one of a first integrated metrology tool and a second integrated metrology tool based upon a difference between metrology data relating to said processed semiconductor wafer acquired by said fast integrated metrology tool and metrology data acquired by said second integrated metrology tool, using a controller.

11. A method, comprising:
processing a semiconductor wafer;
acquiring integrated metrology data from said processed semiconductor wafer using an integrated metrology tool;
acquiring standalone metrology data from said processed semiconductor wafer using a standalone metrology tool; and
performing a calibration function upon at least one of said integrated metrology tool and said standalone metrology tool, said calibration function comprising determining a difference between said integrated metrology data and said standalone metrology data using a controller and calibrating at least one of said integrated metrology tool and said standalone metrology tool based upon said difference.

12. The method described in claim 11, wherein processing a semiconductor wafer comprises processing a test wafer.

13. The method described in claim 11, wherein processing a semiconductor wafer comprises processing a production wafer.

14. The method described in claim 11, wherein acquiring standalone metrology data from said processed semiconductor wafer further comprises acquiring inline metrology data using said standalone metrology tool.

15. The method described in claim 11, wherein acquiring standalone metrology data from said processed semiconductor wafer further comprises acquiring offline metrology data using said standalone metrology tool.

16. The method described in claim 11, wherein acquiring standalone metrology data from said processed semiconductor wafer further comprises acquiring data substantially the same to said integrated metrology data.

17. The method described in claim 11, wherein performing a calibration function upon at least one of said integrated metrology tool and said standalone metrology tool further comprises comparing said integrated metrology data with a reference data.

18. The method described in claim 11, wherein performing a calibration function upon at least one of said integrated metrology tool and said standalone metrology tool further comprises comparing said standalone metrology data with a reference data.

19. The method of claim 11, wherein performing a calibration function upon at least one of said integrated metrology tool and said standalone metrology tool further comprises defining a linear equation that comprises a slope variable to define an amount of matching and an intercept variable to define an adjustment based upon a value of said slope variable.

20. A system comprising:
a processing tool comprising an integrated metrology tool, said integrated metrology tool adapted to acquire integrated metrology data related to a semiconductor wafer processed by said processing tool;
a standalone metrology tool communicatively coupled to said processing tool, said standalone metrology tool to acquire standalone metrology data from said semiconductor wafer; and
a process controller operatively coupled to said integrated metrology tool and said standalone metrology tool, said process controller to calibrate at least one of said integrated metrology tool and said standalone metrology tool based upon a difference between said integrated metrology data and said standalone metrology data.

21. The system of claim 20, further comprising:
a computer system operatively coupled to said process controller, said computer system to calculate said difference between said integrated metrology data and said standalone metrology data; and
a calibration/matching unit operatively coupled to said computer system, said calibration/matching unit to perform a calibration of at least one parameter relating to at least one of said integrated metrology tool and said standalone metrology tool based upon said difference between said integrated metrology data and said standalone metrology data.

22. The system of claim 21, wherein said computer system is capable of generating modification data for modifying at least one parameter relating to at least one of said integrated metrology tool and said standalone metrology tool.

23. An apparatus, comprising:
means for processing at least one semiconductor wafer; and
means for calibrating at least one of an integrated metrology tool and a standalone metrology tool based upon a difference between metrology data relating to said processed semiconductor wafer acquired by said integrated metrology tool and metrology data acquired by said standalone metrology tool, using a controller.

24. An apparatus, comprising:
a process controller operatively coupled to a processing tool and a standalone metrology tool, said process controller to calibrate at least one of an integrated metrology tool and said standalone metrology tool based upon a difference between metrology data relating to a processed semiconductor wafer acquired by said integrated metrology tool and a metrology data acquired by said standalone metrology tool.

25. The apparatus of claim 24, further comprising:
a computer system operatively coupled to said process controller, said computer system to calculate said difference between said integrated metrology data and said standalone metrology data; and
a calibration/matching unit operatively coupled to said computer system, said calibration/matching unit to perform a calibration of at least one parameter relating to at least one of said integrated metrology tool and said standalone metrology tool based upon said difference between said integrated metrology data and said standalone metrology data.

26. A computer readable program storage device encoded with instructions that, when executed by a computer, performs a method comprising matching an integrated metrology tool and a standalone metrology tool based upon a difference between metrology data relating to a processed semiconductor wafer acquired by said integrated metrology tool and metrology data acquired by said standalone metrology tool, using a controller, wherein said matching comprises performing a calibration function upon at least one of said integrated metrology tool and said standalone metrology tool.

27. The computer readable program storage device encoded with instructions that, when executed by a computer, performs the method of claim 26, wherein matching at least one of an integrated metrology tool and a standalone metrology tool based upon a difference between metrology data relating to said processed semiconductor wafer comprises calculating a difference between metrology data relating to substantially the same metrology data acquired from said integrated metrology tool and said standalone metrology tool.

28. The computer readable program storage device encoded with instructions that, when executed by a computer, performs the method of claim 27, wherein calculating a difference between metrology data relating to substantially the same metrology data acquired from said integrated metrology tool and said standalone metrology tool further comprises acquiring metrology data relating to a first portion of said semiconductor wafer using said integrated metrology toot and acquiring metrology data relating to a first portion of said semiconductor wafer using said standalone metrology tool.

29. The computer readable program storage device encoded with instructions that, when executed by a computer, performs the method of claim 27, wherein calculating a difference between metrology data relating to substantially the same metrology data acquired from said integrated metrology tool and said standalone metrology tool further comprises acquiring inline metrology data using said standalone metrology tool.

30. The computer readable program storage device encoded with instructions that, when executed by a computer, performs the method of claim 27, wherein calculating a difference between metrology data relating to substantially the same metrology data acquired from said integrated metrology tool and said standalone metrology tool further comprises acquiring offline metrology data using said standalone metrology tool.

31. The computer readable program storage device encoded with instructions that, when executed by a computer, performs the method of claim 26, wherein matching at least one of an integrated metrology tool and a standalone metrology tool based upon a difference between metrology data relating to said processed semiconductor wafer further comprises comparing said metrology data acquired by said integrated metrology tool to a reference data.

32. The computer readable program storage device encoded with instructions that, when executed by a computer, performs the method of claim 26, wherein matching at least one of an integrated metrology tool and a standalone metrology tool based upon a difference between metrology data relating to a processed semiconductor wafer further comprises defining a linear equation that comprises a slope variable to define an amount of matching and an intercept variable to define an adjustment based upon a value of said slope variable.

33. The computer readable program storage device encoded with instructions that, when executed by a computer, performs the method of claim 26, wherein matching at least one of an integrated metrology tool and a standalone metrology tool based upon a difference between metrology data relating to said processed semiconductor wafer further comprises comparing said metrology data acquired by said standalone metrology tool to a reference data.

34. The computer readable program storage device encoded with instructions that, when executed by a computer, performs the method of claim 26, wherein matching at least one of an integrated metrology tool and a standalone metrology tool based upon a difference between metrology data relating to a processed semiconductor wafer further comprises matching at least one of a sensitivity of a detector that detects light in a scatterometry-related integrated metrology tool, a parameter relating to measurement of a critical dimension of a structure formed on said semiconductor wafers, and a parameter relating to a measurement of a film thickness of a layer of said semiconductor wafer.

* * * * *

UNITED STATES PATENT AND TRADEMARK OFFICE
CERTIFICATE OF CORRECTION

PATENT NO.         : 6,978,189 B1                                       Page 1 of 1
APPLICATION NO.    : 10/156450
DATED              : December 20, 2005
INVENTOR(S)        : Christopher A. Bode, Matthew A. Purdy and Alexander J. Pasadyn It is certified that error appears in the above-identified patent and that said Letters Patent is hereby corrected as shown below:

Column 12, line 40: "her" should read --further--

Column 13, line 6. change "fast" to --first--

Column 15, line 22 change "toot" to --tool--

Signed and Sealed this

Thirty-first Day of October, 2006

JON W. DUDAS
*Director of the United States Patent and Trademark Office*